United States Patent
Tanaka et al.

[11] Patent Number: 6,163,007
[45] Date of Patent: Dec. 19, 2000

[54] MICROWAVE PLASMA GENERATING APPARATUS WITH IMPROVED HEAT PROTECTION OF SEALING O-RINGS

[75] Inventors: Tsutomu Tanaka, Santa Clara; Thomas Nowak, Sunnyvale; Chau Nguyen, San Jose; Hari Ponnekanti, Fremont; Kevin Fairbairn, Saratoga, all of Calif.

[73] Assignee: Applied Materials, Inc., Santa Clara, Calif.

[21] Appl. No.: 09/272,898

[22] Filed: Mar. 19, 1999

[51] Int. Cl.[7] ................................................. B23K 9/00
[52] U.S. Cl. ...................................... 219/121.48; 156/345
[58] Field of Search .................... 219/121.41, 121.36, 219/121.48, 121.52; 156/345; 118/723 MW; 204/298.38

[56] References Cited

U.S. PATENT DOCUMENTS

| | | | |
|---|---|---|---|
| 3,628,175 | 12/1971 | Rigden ..................................... | 372/107 |
| 5,082,517 | 1/1992 | Moslehi .................................. | 156/345 |
| 5,567,243 | 10/1996 | Foster et al. ............................ | 118/730 |
| 5,722,668 | 3/1998 | Rice et al. ............................... | 277/650 |
| 5,892,328 | 4/1999 | Shang et al. ........................ | 315/111.51 |
| 5,895,548 | 4/1999 | Ettinger et al. .......................... | 156/345 |
| 5,961,776 | 10/1999 | Sato et al. ................................ | 156/345 |

*Primary Examiner*—Teresa Walberg
*Assistant Examiner*—Quang Van
*Attorney, Agent, or Firm*—Irwin Ostroff

[57] ABSTRACT

Apparatus for dissociating cleaning gas such as $NF_3$ for use in semiconductor manufacturing includes a housing enclosing a microwave resonator to which microwave energy is applied, a plasma tube within the housing and within which cleaning gas flows and is dissociated by the microwave energy. The plasma tube has two ends into and out of which the cleaning gas flows. A first and a second structural assembly thermally protects and seals each end of the plasma tube against atmospheric leaks. Each structural assembly has a metal collar and a sealing O-ring fitting tightly around a respective end of the plasma tube. Each metal collar includes a thin layer of elastomeric material of high thermal conductivity for conducting heat through the collar away from the end of the plasma tube thereby protecting the O-ring from heat damage. This permits the apparatus to operate more efficiently. A fan forces ambient air over the apparatus.

20 Claims, 2 Drawing Sheets

MICROWAVE PLASMA GENERATING APPARATUS WITH IMPROVED HEAT PROTECTION OF SEALING O-RINGS

FIELD OF THE INVENTION

This invention relates to apparatus for microwave plasma dissociation of cleaning gas (e.g., $NF_3$) used in semiconductor manufacturing, the apparatus having greatly improved heat protection of elastomeric O-rings necessary for sealing against atmospheric leaks.

BACKGROUND OF THE INVENTION

In the manufacture of semiconductors, layers of insulation are formed by chemical vapor deposition (CVD) on thin substrates or wafers, of semiconductive material, such as single-crystal silicon. Certain gases, such as a vapor of an organic liquid and ozone, when mixed together react and deposit insulating material, such as thin layers of silicon dioxide, on exposed surfaces of the semiconductive wafers. Residues of the reactive gases are also deposited on the walls and other surfaces within a chamber in which the wafers are being processed. It becomes necessary therefore periodically to clean the walls and surfaces of the chamber of such accumulated chemical residues since they would otherwise degrade manufacturing quality levels, and possibly affect performance of the semiconductors being produced.

One system currently in use for cleaning a wafer-processing chamber of unwanted chemical residues employs a capacitive radio-frequency (RF) in-situ plasma clean. Disadvantages with such a system include the emissions of perfluoro-compounds (PFCs) that increase global warming through the greenhouse effect, possible damage to critical chamber parts by the RF plasma, and a relatively slow clean time which in turn slows production throughput of semiconductor parts.

Another cleaning technique presently employed uses microwave plasma dissociation of cleaning gas at a location remote from the wafer-chamber. A gas, such as $NF_3$, is passed through a short tube, or applicator, made of a material such as alumina transparent to microwave energy. The tube is mounted within the housing of a microwave resonator. Gas flowing through the tube is dissociated in a hot plasma within the tube when microwave energy is applied to the resonator, and this forms highly reactive species that react with deposition residue within the wafer processing chamber located downstream of the remote plasma source. The plasma tube at its ends, where it enters and leaves the microwave resonator, is typically sealed by elastomeric O-rings to prevent atmospheric leakage into the tube.

The ionized gas in the plasma tube becomes extremely hot (e.g., over 300° C.) and some of this heat is transferred to the wall of the tube. Unless effective steps are taken to prevent it, heat damage, chemical attack accelerated by elevated temperature, or melting of the O-rings at the ends of the plasma tube will take place. This requires that the equipment be shut down, purged of gas, and new O-rings put in place. This is expensive in lost production time as well as in parts and labor in replacing the O-rings.

Previously, with such microwave ionizing apparatus cooling of portions of the apparatus in order to protect the O-rings was effected by liquid flowing in metal tubes placed against or within the apparatus at suitable places and serving as heat sinks. The complexity of this system adds considerably to the overall cost of the apparatus. It is desirable therefore to have a much simpler cooling system. Cooling by forced air alone has been tried, but is only effective for low power plasma sources that cannot supply enough reactive species to be commercially viable.

It is desirable to have a simple, inexpensive, yet highly effective solution to the mechanical and thermal problems of protecting the O-rings from excessive heat and consequent damage.

SUMMARY OF THE INVENTION

The present invention is directed to unique heat sink apparatus for heat protecting O-rings used to seal ends of a plasma tube against atmospheric leaks from semiconductor manufacturing equipment. The plasma tube is mounted at its ends where the tube enters and leaves a housing of a microwave resonator in respective metal clamping rings or collars. Each collar is formed of two identical parts which mate together as an entire ring. Each collar has an outer surface and has an inner surface which closely surrounds the plasma tube and extends a short distance along it. The outer surface of each collar is tapered axially and is adapted to wedge within a similarly tapered surface at a respective end opening in the resonator housing. A thin layer of elastomeric material is wrapped tightly around the outer surface of the plasma tube slightly inboard of each end thereof. This layer of elastomeric material has very high thermal conductivity and is tightly compressed between a respective collar and the tube when the parts are assembled.

When the plasma tube is inserted within the resonator housing, each collar surrounds the tube over a respective end of the tube and is wedged axially against the correspondingly tapered surface of an end opening in the housing. When fully seated in the housing, each collar tightly compresses in a radial direction a respective layer of the special elastomeric material wrapped around the tube. Thus the tube is mechanically held within the housing in a firm yet slightly elastic grip. This permits differential expansion and contraction of parts of the apparatus when it is heated up or cooled down. Because the special elastomeric material has very high thermal conductivity, excess heat from the tube wall is readily conducted through the collars, which are metal, to the resonator housing which is also of metal. The sealing O-rings are mounted, respectively, outboard of the ring collars in an entrance block and in an exit block. Each such block is machined from a sizable piece of metal, such as aluminum having high heat conductivity and chemical resistance to the cleaning gas. A passage is formed within each block through which the cleaning gas can flow into and out of the plasma tube within the microwave resonator. When assembled, these entrance and exit blocks clamp the O-rings and the ring collars tightly in place against the resonator housing. The blocks thus serve as mechanical clamps for the ring collars and for the sealing O-rings. They also serve as heat sinks to help conduct heat away from the ends of the plasma tube and thus help protect the O-rings from heat damage. To further remove unwanted heat from the microwave apparatus forced air is blown over the resonator housing by a fan.

Viewed from one aspect, the present invention is directed to apparatus for dissociating cleaning gas for use in semiconductor manufacturing. The apparatus comprises a housing enclosing a microwave, resonator, a generator for applying microwave energy to the resonator, a hollow member within the housing, and a first and a second structural assembly. Within the hollow member cleaning gas flows and is dissociated by the microwave energy. The hollow member has two ends into and out of which the cleaning gas flows. The first and a second structural assembly thermally protect and for seal each end of the hollow member against atmospheric leaks, each structural assembly fitting tightly around a respective end of the hollow member and having high thermal conductivity for conducting heat away from the end of the hollow member and thereby protecting the apparatus from heat damage and permitting it to operate more efficiently.

Viewed from one aspect, the present invention is directed to apparatus for generating reactive cleaning gas such as used in semiconductor manufacturing. The apparatus comprises a housing enclosing a microwave resonator, means for applying microwave energy to the resonator, a plasma tube (or applicator) within the resonator within which cleaning gas is dissociated by the microwave energy, means for flowing cleaning gas through the plasma tube and means for mounting the plasma tube within the resonator and for sealing each end of the tube against atmospheric leakage. The mounting and sealing means comprises a metal collar, a sealing O-ring, and O-ring clamping means. The metal collar is tightly clamped around the plasma tube near a respective end thereof, the collar being also tightly fitted within an end opening of the housing, the collar and housing having high thermal conductivity and serving as a heat sink for heat generated within the plasma tube. The sealing O-ring is adjacent the collar. The clamping means clamp the O-ring tightly against the plasma tube to seal against atmospheric leaks. The O-ring is protected from heat damage by portions of the mounting means.

Viewed from another aspect, the present invention is directed to apparatus for microwave dissociation of cleaning gas such as $NF_3$ for semiconductor manufacturing. The apparatus comprises a housing enclosing a microwave resonator, the housing being connected to receive microwave energy, a tubular member, first and a second ring collar assemblies, first and second sealing O-rings, and first and second end members. The tubular member is transparent to microwave radiation and is located within the resonator, has two ends, and defines a passage therethrough in which the cleaning gas flows and is ionized by microwave energy. The first and second ring collar assemblies are each clamped around and near one end of the tubular member. Each of the first and second O-rings is fitted around the tubular member at a respective end thereof. Each of the first and second end members engages a respective ring collar assembly and compresses a respective O-ring against the tubular member and itself. The end members and the collar assemblies have high thermal conductivity and serve to conduct heat away from the tubular member and to protect the respective O-rings from excessive heat.

Viewed from still another aspect, the present invention is directed to heat sink apparatus to protect sealing O-rings in apparatus used for manufacturing semiconductors. The heat sink apparatus comprises a hollow member having two ends and through which hot gas can flow, a first and a second sealing O-ring, each ring being clamped to the hollow member near an end thereof, first and second clamping collars, and first and a second metal end plates. The first and a second clamping collars are of high thermal conductivity. Each collar has a thin layer of elastomeric material of high thermal conductivity which is tightly clamped to the hollow member close to a respective O-ring. The first and a second metal end plates each being clamped against a respective O-ring at a respective end of the hollow member and in conjunction with a respective collar serving as a heat sink to prevent heat damage to the O-rings A better understanding of the invention will best be gained from a study of the following description and claims given in conjunction with the accompanying drawings.

DETAILED DESCRIPTION

Figure 1:
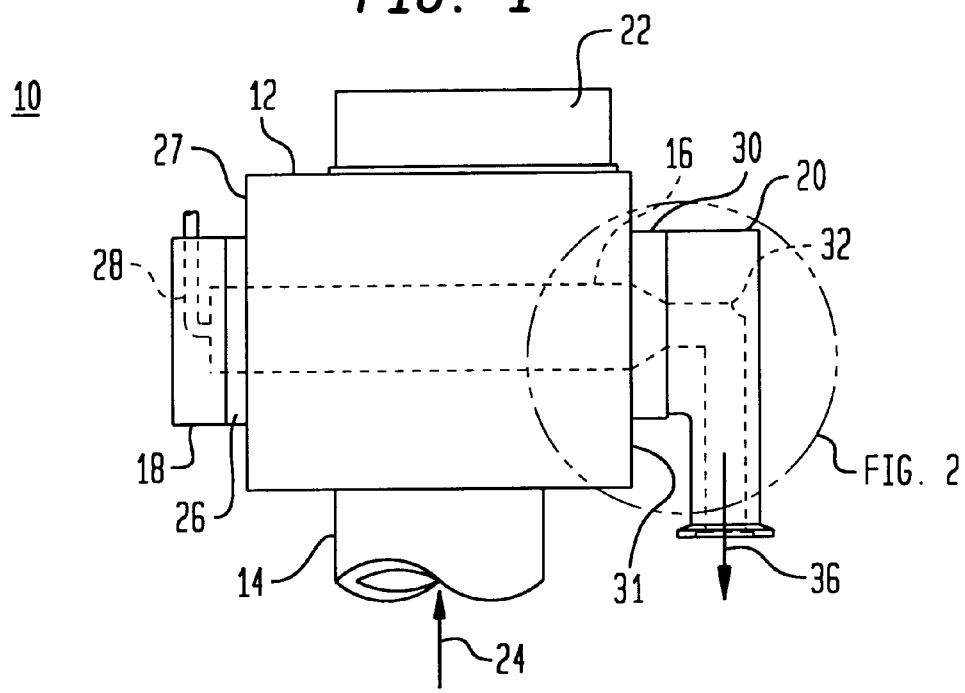
FIG. 1 is a schematic plan view showing a microwave gas-dissociating apparatus embodying features of the invention.

Referring now to FIG. 1, there is shown a schematic plan view of a microwave gas-ionizing apparatus 10 in accordance with the present invention. The apparatus 10 comprises a housing 12 having walls which define a microwave cavity (resonator), a microwave guide 14, a plasma tube 16 (shown in dashed outline) mounted within the housing 12, an entrance block 18, an exit block 20, and an electric fan 22. A microwave generator (e.g., magnetron, not shown) applies power to the end of the wave guide 14, as indicated by an arrow 24, when the apparatus 10 is in operation. By way of example, the microwave generator tube applies 1.5 kilowatt (kW) of power at a frequency of about 2.45 gigahertz (GHz). This amount of power quickly heats ionized gas in the apparatus 10 to a very high temperature. Some of this heat is transferred to walls of the plasma tube 16 and must be efficiently conducted away to protect sealing O-rings 46 (shown in FIG. 2) of the apparatus 10. The microwave generator tube and its associated resonator and plasma tube within the housing 12 are well known in the art. Cleaning gas, by way of example, flows through the plasma tube 16 at sub-atmospheric pressure at approximately 1000 standard cubic centimeters per minute (sccm).

The entrance block 18 is fastened to, and removable from, an end boss 26 which is permanently affixed to an end wall 27 of the housing 12. As will be explained in greater detail hereinafter, there is a circular opening in the boss 26, and in the end wall 27 of the housing 12, through which an end of the plasma tube 16 extends. The entrance block 18 has a passage 28, indicated by dashed lines, through which cleaning gas (e.g., $NF_3$) passes into and through the plasma tube 16. In similar fashion, the exit block 20 is fastened to and removable from an end boss 30 which is permanently affixed to another end wall 31 of the housing 12. There is likewise a circular opening in this end wall 31 and in the boss 30 through which the other end of the plasma tube 16 extends. The exit block 20 has an internal passage 32 (indicated by dashed lines) through which hot dissociated cleaning gas passes out of the plasma tube 16 and from the apparatus 10 to a point of usage (not shown) as indicated by an arrow 36.

Figure 2:
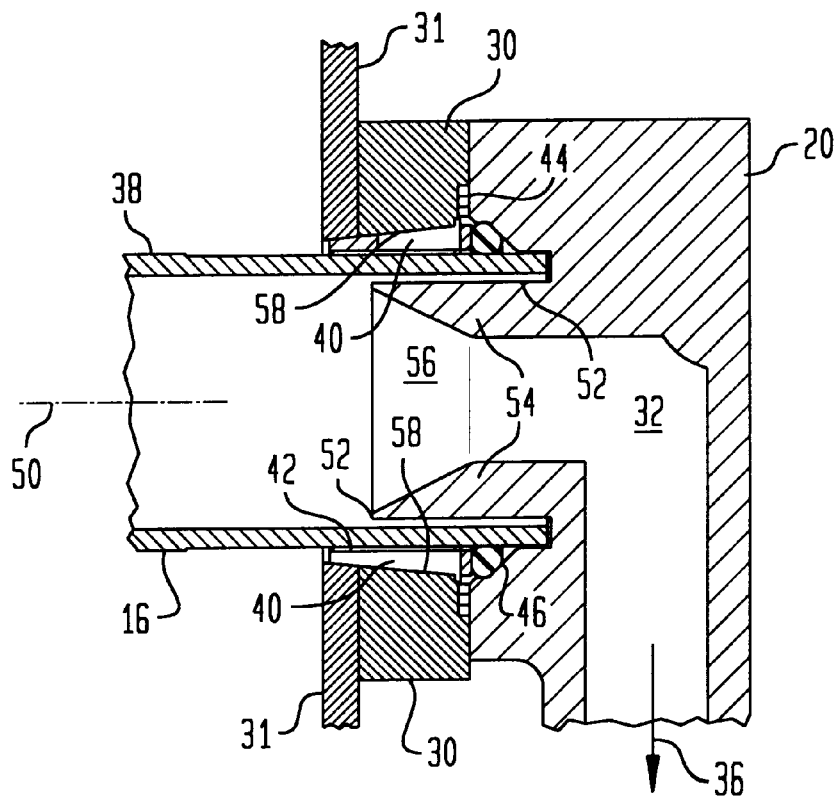
FIG. 2 is a partly broken away enlarged cross sectional view of a portion of FIG. 1 indicated by region 2 of FIG. 1.

Referring now specifically to FIG. 2, there is shown not exactly to scale an end portion of the plasma tube 16 having a cylindrical wall 38, a portion of the end wall 31 of the housing 12, the boss 30, the block 20, a ring collar 40, a thin layer 42 of thermally conductive elastomeric material, a metal face ring 44, and a sealing O-ring 46 of heat resistant elastomeric material. The plasma tube 16 has a central axis 50. The end of the tube 16 extends somewhat beyond the face ring 44, the O-ring 46, and into a thin circular recess or well, indicated at 52, cut into the block 20. A circular portion 54 of the block 20 fits closely within the end of the tube 16 and is coaxial with its axis 50. This circular portion 54 being metal, and a similar structure (not shown) at the other end of the plasma tube 16, help confine the electrical field and ionization of the cleaning gas to a central portion of the plasma tube 16 and away from its ends. This further helps protect both O-rings 42 (only one shown here) from heat damage. A flared opening 56 in the block portion 54 provides an entrance into the internal opening 32 in the block 20 for hot, highly reactive cleaning gas flowing out of the plasma tube 16.

The ring collar 40 comprises two identical interlocking semi-circular pieces (also described hereinafter in connection with FIG. 3) which form a complete circular clamp around the tube 16 and the thin, thermally conductive layer 42. The ring collar 40 has an outer surface 58 which is tapered in the axial direction and which mates with a similarly tapered circular surface inside the boss 30.

The exit block 20 is fastened by screws (not shown) tightly against the boss 30. The boss 30 is permanently affixed to the end wall 31 of the housing 12. The block 20, when thus assembled, pushes against the face ring 44 and wedges the ring collar 40 tightly into the boss 30. When so wedged in place, the collar 40, being two half sections, as will be explained hereinafter, squeezes radially against the elastomeric layer 42 of thermally conductive material and compresses it tightly against the outside wall 38 of the plasma tube 16. The O-ring 46 is tightly compressed by the block 20 against the face ring 44 and the wall 38 of the plasma tube 16, thereby forming a tight seal against atmospheric leakage into the apparatus 10. The O-ring 46 is protected from damage by excessive heat from the plasma tube 16 by the high thermal conductivity of the elastomeric layer 42, the collar 40, the boss 30, the wall 31 of the housing 12, and the exit block 20. These members act as a highly effective heat sink and are themselves cooled by air circulation from the fan 22. It is to be understood that the other end (not shown here) of the plasma tube 16 is clamped in place and sealed by an O-ring in a substantially identical arrangement to that shown in FIG. 2 and described above. By way of example, the plasma tube 16 is made of alumina and is about 8 inches long with an inner diameter of 1.65 inch a wall thickness of about one-eighth inch, and an outer diameter of 1.9 inch.

Figure 3:
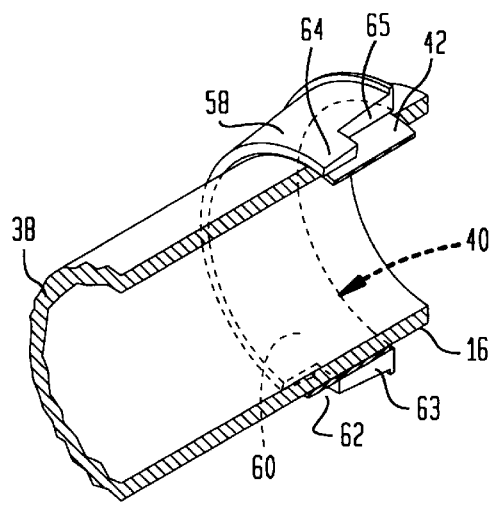
FIG. 3 is a partly broken away enlarged perspective view which is partly in cross-section of a portion of the apparatus of FIG. 2.

Referring now to FIG. 3, there are shown in perspective view a broken-away part of the wall 38 of the plasma tube 16, a half-portion of the ring collar 40, and a portion of the elastomeric layer 42 between the ring collar 40 and the outside of the wall 38 of the plasma tube 16. The ring collar 40 comprises two identical semi-circular parts 60 (only one of which is shown here) which together encircle the plasma tube 16 and when assembled as shown in FIG. 2 wedge within the boss 30 (or the boss 26) and tightly compress the elastomeric layer 42 against the plasma tube 16.

Each semi-circular part 60 of the ring collar 40 has a tapered outer surface 58 (see FIG. 2) and has a cutout or notch 62 on one end 63, and a corresponding tab 64 at by its other end 65. When the two parts 60 of the ring collar 40 are put together the tab 64 on one part 60 fits into and meshes with the notch 62 on the other part 60. This insures that the ring collar 40 fits as a single unit into the boss 30 (or the boss 26) and wedges in place without misalignment of the two semi-circular parts 60. The end 63 of one semi-circular part 60 is opposite and slightly spaced from an end 65 of the other part 60. This slight spacing of the ends 63 and 65 of the two parts 60 of the ring collar 40 when it is assembled and surrounding the plasma tube 16 permits the collar 40 to squeeze the elastomeric layer 42 radially against the plasma tube 16 (see FIG. 2). This provides a path of high thermal conductivity through the elastomeric layer 42 from the plasma tube 16 to the surrounding parts (not shown in FIG. 3, but see FIG. 2) of the apparatus 10. The face ring 44 bridges the ends 63 and 65 of the two parts 60 of the ring collar 40 and prevents the O-ring 46 from being extruded into the spaces between these ends. The face ring 44 also helps insure that the two parts 60 of the ring collar 40 are evenly wedged into the boss 30.

Because the heat conductive layer 42 is elastomeric, all minute voids or air pockets between the collar 40 and the plasma tube 16 are eliminated when it is squeezed radially by the ring collar 40. It has been determined experimentally that when the layer 42 is instead made of thin copper foil, for example, a material with a higher unit thermal conductivity than the elastomeric material, but with little or no ability to fill in any minute voids or air pockets when squeezed between the ring collar 40 and the plasma tube 16, the overall thermal conductivity using copper foil is substantially less than with the elastomeric material of the layer 42. As a result, heat protection of the O-rings 46 is more effective using the special elastomeric material of the layer 42 than when using copper foil. By way of example, the elastomeric material for the layer 42 is advantageously made (of suitable thickness, width and length) from a strip of "Gap Pad VO Soft" (trademark), made by the Bergquist Co., Minneapolis, Minn. Because this material is elastomeric, minor dimensional variations in the plasma tube 16, ring collar 40 and other elements associated therewith are compensated for. The plasma tube 16 is firmly yet resiliently mounted within the housing 12, and differential expansion of parts of the apparatus 10 when it is heated up can take place without damage. The O-rings 46 are made of a commercially available temperature and chemically resistant elastomeric material. The unique end-mounting arrangement illustrated in FIGS. 2 and 3 for the plasma tube 16 of the apparatus 10 has very high thermal conductivity and this provides excellent protection from heat damage for the sealing O-rings 46. This arrangement also makes it easy to assemble and disassemble the apparatus 10. The various parts of this unique arrangement are mechanically rugged yet inexpensive to make.

Figure 4:
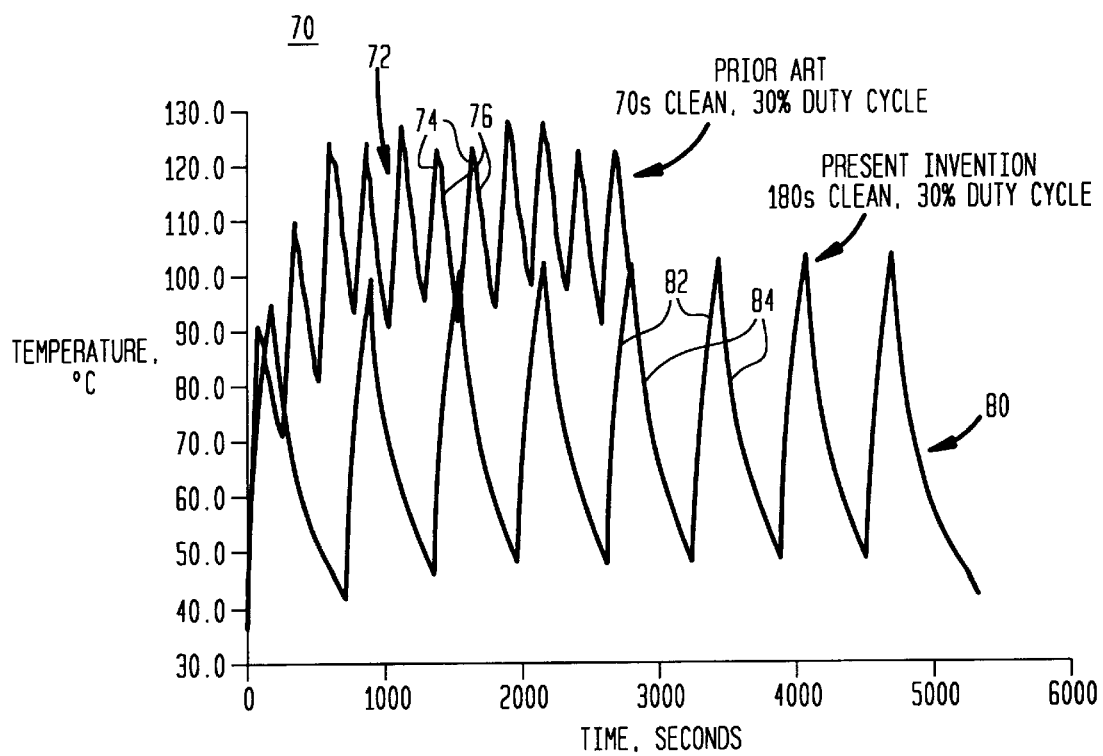
FIG. 4 is a graph illustrating time versus temperature in apparatus embodying the invention compared to prior art apparatus not embodying the invention.

Referring now to FIG. 4 there is shown a graph 70 having curves 72 (representing a prior art apparatus) and 80 (representing apparatus 10 of the present invention) with temperature along a vertical scale versus time along a horizontal scale. The graph 70 schematically illustrates temperature build-up in the vicinity of sealing O-rings (e.g., the O-rings 46) during operating cycles of prior art apparatus compared to the apparatus 10 embodying the present invention. The prior art apparatus was similar to the apparatus 10 but did not embody its unique end-mounting assembly for a plasma tube (such as plasma tube 16).

The curve 72 (representing the prior art apparatus) schematically illustrates rises in temperature (in degrees Centigrade) for a 70 second clean-cycle and a 30% duty (power-on) cycle. During a "clean" portion of a cycle of the prior art apparatus (curve 72) when cleaning gas is being ionized and used to clean a wafer-processing chamber, temperature (as measured in the vicinity of a sealing O-ring) rises from a lower value to a higher value along up-going lines 74, extending for example from about 90° C. to about 120° C. When the prior-art apparatus is turned off, the curve 72 shows temperature falling along down-going lines 76. Had the apparatus been left "on" for more than 70 seconds the temperature would in fact have risen to more than 130° C. and heat damage to the O-rings would be considerably accelerated. Thus "cleaning" of a wafer-processing chamber of unwanted chemical residues is very much time-limited by this prior art apparatus. This in turn means that it is necessary to have more frequent cleaning cycles of a wafer-chamber or to limit the maximum allowable deposition thickness per wafer processed, an undesirable consequence of inadequate heat protection for the sealing O-rings of this prior art apparatus.

The curve 80 (representing the apparatus 10 of the present invention) schematically illustrates rises in temperature for a 180 second clean-cycle and a 30% duty (power-on) cycle of the apparatus 10. Here, temperature in the vicinity of a sealing O-ring 46 during a "clean" portion of a cycle rises along up-going lines 82 from a low of only about 50° C. to a high of only about 100° C. When the apparatus 10 is turned off, the temperature drops along down-going lines 84. It is to be noted that the temperature rapidly drops from its top value of only about 100° C. to somewhat below 50° C. during power-off. This indicates the great effectiveness of the present invention in removing heat from the vicinity of the sealing O-rings 46 in the apparatus 10. Temperature measurements were made here in the vicinity of each of the O-rings 46 sealing the plasma tube 16 and were substantially the same at each end thereof. The much greater "clean" time made possible by the apparatus 10 compared to the prior art apparatus (180 seconds compared to 70 seconds) means that cleaning of a wafer-chamber need be done less often, and each "clean" cycle is able to remove heavier build-ups of unwanted chemical residues. Moreover, the top temperature reached here (only 100° C. versus over 120° C. or more for the prior art) means that the service life of the sealing O-rings 46 of the apparatus 10 is substantially improved compared to prior art apparatus.

Various modifications in the apparatus disclosed may occur to those skilled in the art and can be made without departing from the spirit and scope of the invention as set forth in the accompanying claims. For example, the invention is not limited to particular dimensions or operating conditions for the apparatus 10. Moreover, other equivalent materials may be substituted for certain of the ones disclosed. In addition, the ring collar 40 is not limited in design to two semi-circular parts.

What is claimed is:

1. Apparatus for dissociating cleaning gas for use in semiconductor manufacturing, the apparatus comprising:
    a housing enclosing a microwave resonator;
    a generator for applying microwave energy to the resonator;
    a hollow member within the housing and within which cleaning gas flows and is dissociated by the microwave energy, the hollow member having two ends into and out of which the cleaning gas flows; and
    a first and a second structural assembly for thermally protecting and for sealing each end of the hollow member against atmospheric leaks, each structural assembly being substantially of metal and having an inner elastic portion fitting resiliently without gaps tightly against and around a respective end of the hollow member and having high thermal conductivity for conducting heat away from the end of the hollow member and thereby protecting the apparatus from heat damage and permitting it to operate more efficiently.

2. The apparatus of claim 1 wherein each structural assembly comprises:
    a metal collar and a thin layer of elastomeric material of high thermal conductivity clamped tightly around the hollow member near an end thereof;
    a sealing O-ring of heat resistant elastomeric material adjacent the metal collar and surrounding the hollow member; and
    a metal end piece fitted tightly against the metal collar and clamping the O-ring tightly against itself and the hollow member.

3. The apparatus of claim 2 wherein each metal collar comprises a plurality of identical parts which mesh and which together tightly clamp the thin layer of elastomeric material around the hollow member, the thin layer being clamped tightly enough to eliminate minute voids or air spaces in the thin layer such that the metal collar and thin layer provide thermal conductivity approaching that of solid metal, and the hollow member is resiliently mounted.

4. The apparatus of claim 3 wherein the housing has an opening at each end, the ends of the hollow member projecting through these openings, and the parts of each metal collar are axially wedged into a respective one of these openings.

5. The apparatus of claim 4 wherein each metal end piece has an internal passage for flow of cleaning gas through the hollow member, each end piece being removably fastened to the housing across a respective end opening of the housing, such that parts of the apparatus are easily assembled and disassembled.

6. The apparatus of claim 5 wherein the hollow member is a tube of alumina about 8 inches long and almost 2 inches in diameter, and the microwave power applied to the resonator is about 1.5 kilowatts.

7. The apparatus of claim 6 in further combination with means for air cooling the apparatus.

8. Apparatus for dissociating cleaning gas such as used in semiconductor manufacturing, the apparatus comprising:
    a housing enclosing a microwave resonator;
    means for applying microwave energy to the resonator;
    a plasma tube within the resonator within which cleaning gas is ionized by the microwave energy;
    means for flowing cleaning gas through the plasma tube; and
    means for mounting the plasma tube within the resonator and for sealing each end of the tube against atmospheric leakage, the mounting and sealing means comprising:
        a metal collar tightly clamped around the plasma tube near a respective end thereof, the collar being also tightly fitted within an end opening of the housing, the collar and housing having high thermal conductivity and serving as a heat sink for heat generated within the plasma tube;
        a thin layer of elastomeric material having heat transfer efficiency greater than that of a thin layer of copper foil, the elastomeric layer being compressed between the collar and the plasma tube such that voids between the collar and plasma tube are eliminated:
        a sealing O-ring adjacent the collar; and
        means for clamping the O-ring tightly against the plasma tube to seal against atmospheric leaks, the O-ring being protected from heat damage by portions of the mounting means.

9. The apparatus of claim 8 wherein the O-ring clamping means comprises an end block which has an internal passage for the flow of cleaning gas through the plasma tube, the block being of metal, the block securing the metal collar in place and together with the collar and housing serving as a heat sink to protect the O-ring.

10. The apparatus of claim 8 wherein the metal collar comprises two semi-circular parts which mesh together and fit closely around the plasma tube.

11. The apparatus of claim 10 in further combination with means for forcing ambient air over and around the apparatus.

12. The apparatus of claim 10 in which the plasma tube is about eight inches long and almost two inches in outer diameter, and is made of alumina.

13. Apparatus for microwave dissociation of cleaning gas such as $NF_3$ for semiconductor manufacturing, the apparatus comprising:

a housing enclosing a microwave resonator, the housing being connected to receive microwave energy;

a tubular member transparent to microwave radiation and located within the resonator, the tubular member having two ends and defining a passage therethrough in which the cleaning gas flows and is ionized by microwave energy;

a first and a second ring collar assembly each of which has an inner elastic portion and each of which is clamped resiliently and tightly against and around the tubular member near a respective end thereof;

a first and a second sealing O-ring, each of which is fitted around the tubular member at a respective end thereof; and a first and a second end member, each of which tightly engages a respective ring collar assembly and compresses a respective O-ring against the tubular member and itself, the end members and the collar assemblies having high thermal conductivity substantially equal to that of metal and serving to conduct heat away from the tubular member and to protect the respective O-rings from excessive heat.

14. The apparatus of claim 13 in which each of the ring collar assemblies includes a thin layer of elastomeric material of high thermal conductivity compressed tightly directly against the tubular member.

15. The apparatus of claim 13 in which each of the collar assemblies comprises:

a thin layer of elastomeric material having high thermal conductivity;

two semi-circular pieces of metal which surround the tubular member and tightly clamp the thin layer against it; and a face ring bridging the ends of the two pieces of metal surrounding the tubular member.

16. Apparatus for ionizing cleaning gas such as used in semiconductor manufacturing, the apparatus comprising:

a housing enclosing a microwave resonator;

means for applying microwave energy to the resonator;

a plasma tube within the resonator within which cleaning gas is ionized by the microwave energy, the plasma tube having two ends extending through corresponding end openings in the housing;

means for flowing cleaning gas through the plasma tube;

a first and a second thin layer of elastomeric material having high thermal conductivity and each being wrapped around the plasma tube near respective ends thereof;

a first and a second metal collar, each of which is tightly clamped around the respective thin layer wrapped around the plasma tube, each collar being tightly wedged within a respective end opening of the housing, each collar and thin layer and the housing having high thermal conductivity with heat transfer efficiency substantially equal to that of metal and serving to remove heat from the ends of the plasma tube;

a first and a second sealing O-ring, each adjacent a respective collar; and a first and a second end block for clamping a respective O-ring tightly around the plasma tube to seal against atmospheric leaks, each end block having an internal passage for the flow of cleaning gas through the plasma tube, the block being of metal, each block securing a respective metal collar in place and together with the collar and housing serving as a heat sink to protect a respective O-ring and permitting thermal expansion of the plasma tube such that the overall effectiveness of the apparatus is improved.

17. The apparatus of claim 16 wherein each metal collar comprises a plurality of identical parts which mesh and which together tightly clamp a respective thin layer of elastomeric material around the plasma tube, the thin layer being clamped tightly enough to eliminate minute voids or air spaces in the thin layer such that the metal collar and thin layer provide thermal conductivity approaching that of solid metal, and the hollow member is resiliently mounted.

18. The apparatus of claim 17 wherein each end block is removably fastened to the housing across a respective end opening of the housing, each end block having a circular portion which extends within a respective end of the plasma tube such that parts of the apparatus are easily assembled and disassembled and ionization of the cleaning gas is confined to a central portion of the plasma tube.

19. Heat sink apparatus to protect sealing O-rings in apparatus used for manufacturing semiconductors, the heat sink apparatus comprising:

a hollow member having two ends and through which hot gas can flow;

a first and a second sealing O-ring, each ring being clamped to the hollow member near an end thereof;

a first and a second clamping collar of high thermal conductivity, each collar having a thin layer of elastomeric material of high thermal conductivity which is tightly clamped to the hollow member close to a respective O-ring, each collar and thin layer of elastomeric material having a heat transfer efficiency substantially equal to that of metal; and a first and a second metal end plate, each plate being clamped against a respective O-ring at a respective end of the hollow member and in conjunction with a respective collar serving as a heat sink to prevent heat damage to the O-rings.

20. The heat sink apparatus of claim 19 in which each collar is made of a plurality of metal pieces which mesh together and tightly clamp a respective thin layer of elastomeric material of high thermal conductivity around the hollow member, such that the collars and end plates protect the O-rings from damage by excessive heat from the hollow member, and parts of the apparatus are able to differentially expand or contract when heated up or cooled down.

* * * * *